United States Patent
Sadd et al.

(10) Patent No.: US 9,515,635 B1
(45) Date of Patent: Dec. 6, 2016

(54) PROGRAMMABLE RESISTIVE ELEMENTS AS VARIABLE TUNING ELEMENTS

(71) Applicant: FREESCALE SEMICONDUCTOR, INC., Austin, TX (US)

(72) Inventors: Michael A. Sadd, Austin, TX (US); Anirban Roy, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 14/807,157

(22) Filed: Jul. 23, 2015

(51) Int. Cl.
*H03J 5/02* (2006.01)

(52) U.S. Cl.
CPC ............. *H03J 5/02* (2013.01); *G02F 2203/48* (2013.01)

(58) Field of Classification Search
CPC ................................ G02F 2203/48; H03J 5/02
USPC ........................................................ 327/308
See application file for complete search history.

(56) References Cited

U.S. PATENT DOCUMENTS

| | | | |
|---|---|---|---|
| 6,985,383 B2 | 1/2006 | Tang et al. | |
| 7,902,857 B1 | 3/2011 | Pino | |
| 8,274,312 B2 | 9/2012 | Pino et al. | |
| 8,416,604 B2 | 4/2013 | Kim et al. | |
| 8,710,865 B2 | 4/2014 | Yang et al. | |
| 2006/0109042 A1* | 5/2006 | Hsu ........................ | H03H 11/24 327/276 |

OTHER PUBLICATIONS

Chua, "The Fourth Element", Proceedings of the IEEE, Jun. 2012, pp. 1920-1927, vol. 100, No. 6.
Erdi, "A Precision Trim Technique for Monolithic Analog Circuits", IEEE Journal of Solid-State Circuits, Dec. 1975, pp. 412-416, vol. SC-10, No. 6.
Jackson et al, "A Programmable Current Mirror for Analog Trimming Using Single-Poly Floating-Gate Devices in Standard CMOS Technology", IEEE Transactions on Circuits and Systems-II: Analog and Digital Signal Processing, Jan. 2001, pp. 100-102, vol. 48, No. 1.
Kim et al, "Memristor-based Multilevel Memory", 2010 12th International Workshoop on Cellular Nanoscale Networks and their Applications (CNNA), 2010, pp. 1-6.
Lanzoni et al, "Automatic and Continuous Offset Compensation of MOS Operational Amplifiers Using Floating-Gate Transistors", IEEE Journal of Solid-State Circuits, Feb. 1998, pp. 287-290, vol. 33, No. 2.
Merrikh-Bayat et al, "A method for automatic tuning the memristance of memristive devices with the capacity of applying to memristive memories", International Conference on Computer Systems and Industrial Informatics (ICCSII), 2012, pp. 1-6.

(Continued)

*Primary Examiner* — William Hernandez

(57) ABSTRACT

The present disclosure provides circuit and method embodiments for calibrating a signal of an integrated circuit. A programmable resistive element is coupled in series with a node of the integrated circuit, where at least part of the integrated circuit is formed in at least one front end of line (FEOL) device level. The programmable resistive element is formed in at least one back end of line (BEOL) wiring level, and the programmable resistive element is in a non-volatile resistive state that is variable across a plurality of non-volatile resistive states in response to a program signal applied to the programmable resistive element.

9 Claims, 4 Drawing Sheets

(56) References Cited

OTHER PUBLICATIONS

Nguyen et al, "Nulling Input Offset Voltage of Operational Amplifiers", Texas Instruments Application Report SLOA045, Aug. 2000, pp. 1-15.
Pershin et al, "Practical Approach to Programmable Analog Circuits With Memristors", IEEE Transactions on Circuits and Systems—I: Regular Papers, Aug. 2010, pp. 1857-1864, vol. 57, No. 8.
Shin et al, "Memristor Applications for Programmable Analog ICs", IEEE Transactions on Nanotechnology, Mar. 2011, pp. 266-274, vol. 10, No. 2.
Chua, "Memristor—The missing circuit element", IEEE Transactions on Circuit Theory, Sep. 1971, pp. 507-519, vol. 18, Issue 5.
Strukov et al, "The missing memristor found", Nature, May 1, 2008, pp. 80-83, vol. 453.
Yu et al, "Compact Modeling of Conducting-Bridge Random-Access Memory (CBRAM)", IEEE Transactions on Electron Devices, May 2011, pp. 1352-1360, vol. 58, No. 5.
Wouters, Dirk, "Resistive Switching Materials and Devices for Future Memory Applications", Tutorial SISC San Diego, Dec. 5, 2012, 160 pages.

\* cited by examiner

PROGRAMMABLE RESISTIVE ELEMENTS AS VARIABLE TUNING ELEMENTS

FIELD

This disclosure relates generally to trimming circuits, and more specifically, to utilizing programmable resistive elements as variable tuning elements in trimming circuits.

RELATED ART

In semiconductor integrated circuits, resistance tuning is often performed to adjust characteristics of an electronic circuit to achieve a desired operation setting. For example, a trimming circuit may permanently break one or more fuses to adjust the resistance of circuit elements in a semiconductor integrated circuit.

BRIEF DESCRIPTION OF THE DRAWINGS

The present invention may be better understood, and its numerous objects, features, and advantages made apparent to those skilled in the art by referencing the accompanying drawings.

The present invention is illustrated by way of example and is not limited by the accompanying figures, in which like references indicate similar elements, unless otherwise noted. Elements in the figures are illustrated for simplicity and clarity and have not necessarily been drawn to scale.

DETAILED DESCRIPTION

The following sets forth a detailed description of various embodiments intended to be illustrative of the invention and should not be taken to be limiting.

Overview

Resistor tuning of a circuit is often performed with polysilicon resistors and select transistors. Polysilicon resistors are formed during a front-end-of-line (FEOL) semiconductor device fabrication process. However, polysilicon resistors that have good process control are large, such as 1×5.5 microns. Further, polysilicon resistors are utilized in a discrete or digital trim option, such as a resistor ladder implementation having a number of taps that each produce a different voltage. Also, resistor trim information must be stored in non-volatile memory on power-down of the circuit. Such a scheme also requires logic circuits and signal routing in order to retrieve and restore the saved resistor trim information. Finally, as circuits scale down, it is increasingly difficult to also scale down transistor size to meet mismatch requirements, due to a limit on transistor finger size.

The present disclosure provides for utilizing programmable resistive elements as variable tuning elements, which are configured to trim or tune electrical characteristics of circuitry. Programmable resistive elements are formed during a back-end-of-line (BEOL) semiconductor device fabrication process. Programmable resistive elements are small, similar in size to a via. Programmable resistive elements formed during the BEOL process can stack over devices formed during the FEOL process. Trim information may also be stored locally, as the programmable resistive elements store such information in a non-volatile manner, even after power-down of the circuit. Accordingly, such a scheme does not require a separate non-volatile memory to store the trim information. Finally, the devices formed during the FEOL process (such as transistors and polysilicon resistors) may be smaller sized since any mismatch will be accounted for in the tuning by the programmable resistive element.

One or more programmable resistive elements may be utilized to tune a current or voltage reference generation circuit. The one or more programmable resistive elements may be coupled to one of a front-end device formed during the FEOL process (e.g., a polysilicon resistor), a feedback circuit (e.g., a circuit involving an operational amplifier), or a programming connection utilized to adjust the programmable resistive element. One or more programmable resistive elements may also be utilized to cancel mismatch in a differential circuit, such as within an operational amplifier. The one or more programmable resistive elements may be coupled to one of a matched set of transistors (e.g., a current mirror circuit), or a programming connection utilized to adjust the element in a way that cancels the mismatch in the differential circuit.

Example Embodiments

Figure 1:
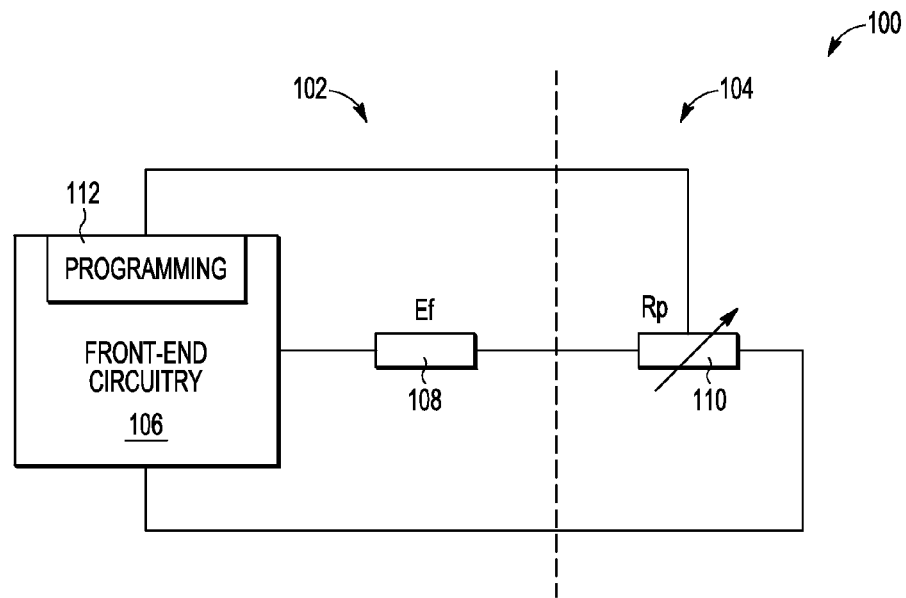
FIG. 1 illustrates a block diagram depicting an example circuit in which the disclosure is implemented, according to some embodiments.

FIG. 1 illustrates a block diagram depicting an example semiconductor integrated circuit 100 in which the disclosure is implemented. Components of integrated circuit 100 are formed during conventional semiconductor device fabrication processes, known by one skilled in the art as front-end-of line (FEOL) processing and back-end-of-line (BEOL) processing. During FEOL processing, semiconductor devices (e.g., transistors, resistors, and the like) of an integrated circuit (like circuit 100) are formed on a semiconductor substrate. FEOL processing utilizes a number of formation steps, such as growth and deposition of semiconductor material layers, patterning and etching of the layers, implantation and diffusion of dopants to achieve desired electrical properties, and the like. FEOL processing forms the semiconductor devices within a number of device levels built up on the semiconductor substrate.

During BEOL processing (which is performed subsequent to FEOL processing), the semiconductor devices are electrically interconnected to complete the integrated circuit. BEOL processing also utilizes a number of formation steps, such as deposition of metal, dielectric, and other semiconductor material layers, patterning and etching of the layers to form metal interconnects, and the like. BEOL processing forms metal interconnects (and other components further discussed below) within a number of wiring levels built up on the semiconductor substrate over the FEOL device levels.

Integrated circuit 100 includes components formed during FEOL processing, which are illustrated as components within device levels 102, and components formed during BEOL processing, which are illustrated as components within wiring levels 104. FEOL components 102 include front-end circuitry 106, programming circuit 112, and front-end element Ef 108. BEOL components 104 include programmable resistive element Rp 110.

Front-end circuitry 106 includes other components of integrated circuit 100. Examples of components included in front-end circuitry 106 include, but are not limited to, transistors, resistors, capacitors, programmable resistive elements, comparators, operational amplifiers, logic gates, feedback circuits, and the like. Front-end circuitry 106 is coupled to Ef 108 and to Rp 110.

Programming circuit 112 is coupled to Rp 110 and to one or more components of front-end circuitry 106. Programming circuit 112 is configured to measure a signal of the one or more components of front-end circuit 106 (e.g., take one or more voltage readings, current readings, or both) and determine whether such measurements indicate that tuning of front-end circuitry 106 is required, such as determining whether the measurements fall within a target signal range (e.g., whether the voltage or current readings exceed a maximum threshold value, fail to exceed a minimum threshold value, or both). The target signal range may be defined around a reference voltage signal or around a reference current signal. In response to determining that the one or more measurements indicate that tuning is required, programming circuit 112 is configured to tune electrical characteristics of front-end circuitry 106 by utilizing programmable resistive element Rp 110 as a variable tuning element.

Programmable resistive element Rp 110 represents a resistive element whose resistance can be adjusted (or programmed) to a desired resistive value. Once Rp 110 is programmed to a desired resistive value, Rp 110 is configured to hold the programmed resistive value until a next resistive value is programmed. As such, the resistive values of Rp 110 are also referred to as non-volatile resistive states, where Rp 110 remains in a present non-volatile resistive state until a next non-volatile resistive state is programmed. The non-volatile resistive states are also equivalent to trim information, such as trim settings. By remaining in a particular non-volatile resistive state, Rp 110 effectively stores a corresponding trim setting that would conventionally be indicated by trim information. In the event that circuit 100 is powered down (e.g., power failure or reset), Rp 110 continues to hold the particular non-volatile resistive state and maintains the corresponding trim setting in a non-volatile manner. Accordingly, circuit 100 does not need to include additional circuitry for restoring trim information.

In some embodiments, programmable resistive element Rp 110 includes a single programmable resistive element that is programmable across two non-volatile resistive states: a high resistive state and a low resistive state. In other embodiments, programmable resistive element Rp 110 includes a single programmable resistive element that is programmable across more than two non-volatile resistive states (e.g., high, medium, and low resistive states, or more than three states). In still other embodiments, programmable resistive element Rp 110 includes two or more programmable resistive elements that together implement two or more resistive states. For example, programmable resistive element Rp 110 can be implemented as an array of programmable resistive elements that together implement a large number of non-volatile resistive states, where the resistance state of each programmable resistive element contributes to the overall resistance state of the array. An embodiment of an array of programmable resistive elements implemented as a variable tuning element is discussed below in connection with FIG. 5. The use of one or more programmable resistive elements as a variable tuning element for tuning electrical characteristics of front-end circuitry is further discussed below in connection with FIGS. 2, 3, and 4.

Programming circuit 112 is configured to program Rp 110 to a desired resistive state by applying an appropriate program signal, such as a voltage signal or current signal, to Rp 110. The desired resistive state of Rp 110 is selected from among a number of possible non-volatile resistive states, where each non-volatile resistive state has a corresponding program signal that has an associated magnitude, polarity, and duration. At the end of the BEOL process, many types of programmable resistive elements have a high resistance, so the polarity of the program signal is known. Since the non-volatile resistive states of Rp 110 correspond to a resistive value, the non-volatile resistive states can be ordered, based on the ordering of the corresponding resistive values (e.g., from lowest to highest). Each resistance value has a neighboring resistance value, which may be a higher resistance value or a lower resistance value, where the corresponding resistive states are characterized as neighboring states. The program signals output by programming circuit 112 include program signals configured to change the resistive state of Rp 110 in a stepwise manner (e.g., a present resistive state is changed to a neighboring resistive state that is higher or lower than the present resistive state), in a cumulative manner (e.g., a present resistive state is changed to a non-neighboring resistive state that is higher or lower than the present resistive state, where several resistive states intervene between the present resistive state and the non-neighboring resistive state), or both.

Programming circuit 112 is configured to select a program signal that corresponds to a non-volatile resistive state that will tune or alter the electrical characteristics of front-end circuitry 106 in order for a measured signal of the one or more components of front-end circuitry 106 to fall within a target signal range. One or more secondary signal ranges may also be defined outside of the target signal range, such as ranges greater than the maximum threshold value and ranges less than the minimum threshold value. For example, if programming circuit 112 detects that the measured signal falls outside of the target signal range (e.g., exceeds a maximum threshold value or fails to exceed a minimum threshold value), programming circuit 112 is configured to further determine a secondary signal range within which the measured signal falls. Programming circuit 112 is configured to adjust the resistive state of Rp 110 to another resistive state by applying a program signal associated with the secondary signal range within which the measured signal falls, in order to adjust the measured signal to fall within the target signal range. In some embodiments, programming circuit 112 is configured to take periodic measurements after programming Rp 110, and may select another program signal to further tune front-end circuitry 106.

Programming circuit 112 is also configured to output an active tune signal to indicate a program mode during which Rp 110 is being programmed. When Rp 110 is not being programmed, programming circuit 112 is configured to output an inactive or cleared tune signal to indicate that front-end circuitry 106 is in an operating mode. In some embodiments, the tune signal is also utilized to control one or more switches to isolate programmable resistive element Rp 110 from front-end circuitry 106 when applying a large program signal to Rp 110.

Front-end element Ef 108 is a circuit component of integrated circuit 110. Examples of front-end element 108 include, but are not limited to, transistors, resistors, capacitors, programmable resistive elements, operational amplifiers, logic gates, and the like. In the embodiment illustrated, Ef 108 is coupled to Rp 110 in series. In some embodiments, Ef 108 is a front-end resistor formed from polysilicon. It is beneficial to include front-end element Ef 108 in series with Rp 110 to minimize any disturb on Rp 110, which also minimizes the risk of Rp 110's programmed resistive state from drifting or changing over time. In embodiments where fine tuning is needed, front-end element Ef 108 can be implemented as a resistor that has a known resistance value larger than that of Rp 110 in order to reduce the voltage drop over Rp 110, as compared to the voltage drop over Rp 110 if Ef 108 were not present. In such embodiments, the inclusion of Ef 108 in series with Rp 110 results in a smaller adjustment in the resistive state of Rp 110 needed to tune front-end circuitry 106, as compared with a larger adjustment in the resistive state of Rp 110 needed if Ef 108 were not present.

Figure 6:
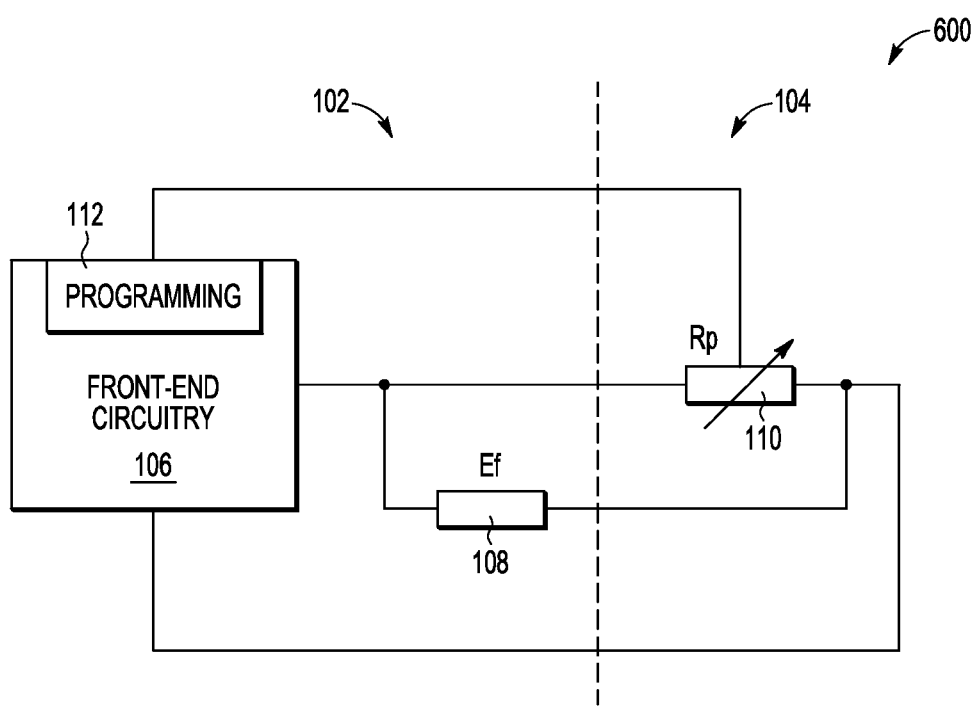
FIG. 6 illustrates a block diagram depicting another example circuit in which the disclosure is implemented, according to some embodiments.

FIG. 6 illustrates another example integrated circuit 600 including components similar to those illustrated in FIG. 1. In the embodiment illustrated, Ef 108 is coupled to Rp 110 in parallel. This embodiment is beneficial if the desired target resistance of the pair Ef 108 and Rp110 is less than the tuning range of Rp 110 alone. It is also beneficial to include front-end element Ef 108 in parallel with Rp 110 to minimize any disturb on Rp 110, which also minimizes the risk of Rp 110's programmed resistive state changing over time. In embodiments where fine tuning is needed, Ef 108 can be implemented as a resistor that has a known resistance value smaller than that of Rp 110 in order to reduce the current through Rp 110, as compared to the current through Rp 110 if Ef 108 were not present. In such embodiments, the inclusion of Ef 108 in parallel with Rp 110 results in a smaller adjustment in the resistive state of Rp 110 needed to tune front-end circuitry 106, as compared with a larger adjustment in the resistive state of Rp 110 needed if Ef 108 were not present.

Figure 5:
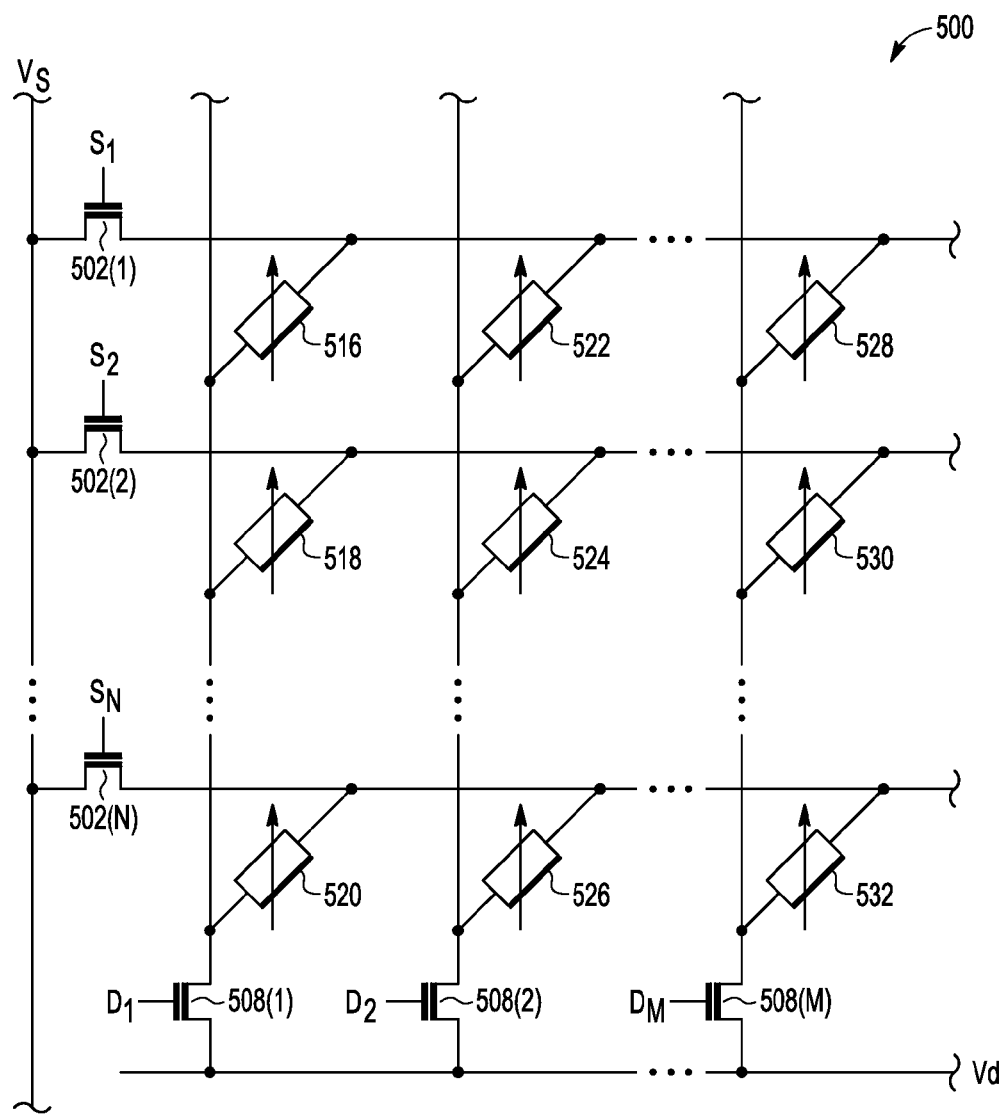
FIG. 5 illustrates a block diagram depicting an example programmable resistive element array in which the disclosure is implemented, according to some embodiments.

FIG. 5 illustrates a block diagram depicting an example programmable resistive element array 500 that can be utilized as a variable tuning element. Array 500 includes a number of programmable resistive elements 516-532 arranged in N rows by M columns, where N and M are each an integer of one or greater. Array 500 also includes a column of switches 502(1)-(N), where each switch 502 has a current electrode coupled to a source voltage (Vs) line. Each switch 502 has another current electrode coupled to the electrodes of a respective row of programmable resistive elements. For example, switch 502(1) has a current electrode coupled to the electrodes of a row of programmable resistive elements including elements 516, 522, and 528. Each switch 502 also has a control electrode that is coupled to a respective one of control signals S(1)-(N) output by programming circuit 112.

Array 500 also includes a row of switches 508(1)-(N), where each switch 508 has a current electrode coupled to a drain voltage (Vd) line. Each switch 508 has another current electrode coupled to the electrodes of a respective column of programmable resistive elements. For example, switch 508(1) has a current electrode coupled to the electrodes of a column of programmable resistive elements including elements 516, 518, and 520. Each switch 508 also has a control electrode that is coupled to a respective one of control signals D(1)-(N) output by programming circuit 112.

An overall resistive value provided by array 500 is a parallel combination of the individual resistive values of the programmable resistive elements within array 500, where array 500 is programmable over a large number of non-volatile resistive states that are implemented by the summed resistive values of differing numbers of the programmable resistive elements. In some embodiments, each programmable resistive element utilized in array 500 is programmable over a high resistive state and a low resistive state. The overall resistive state of array 500 is programmed by programming circuit 112, which applies a program signal to one or more selected programmable resistive elements within array 500 to change their resistive states. The one or more programmable resistive elements are selected by closing one or more of switches 502(1)-(N) and one or more of switches 508(1)-(M). As noted above, each non-volatile resistive state has a corresponding program signal that has an associated magnitude, polarity, and duration. In some embodiments, the selected programmable resistive elements change their states stochastically, where the resulting number of programmable resistive elements that change resistive state corresponds to the duration time of the program signal (or the length of time during which the program signal is applied). Preferably, the programmable resistive elements change their states at a consistent rate during programming, in order to provide reproducible stepwise increases or decreases in the overall resistive state.

To change the overall resistive value of array 500, programming circuit 112 is configured to close one or more of switches 502(1)-(N) by applying an appropriate control signal S to the one or more selected switches 502, and to close one or more of switches 508(1)-(M) by applying an appropriate control signal D to the one or more selected switches 508, which selects at least one programmable resistive element to receive voltages from Vs and Vd lines. Programming circuit 112 is also configured to open the unselected switches 502 and 508 by applying appropriate control signals S and D. Other numbers of programmable resistive elements can be selected, such as one or more rows of elements, one or more columns of elements, or other number of elements up to and including the entire array. In some embodiments, switches 502(1)-(N) and switches 508(1)-(M) are implemented using a type of transistor suitable for implementing the control signal scheme discussed herein, including an n-channel transistor, a p-channel transistor, or other suitable switching device.

To raise the overall resistive value of array 500, programming circuit 112 is configured to apply a program signal to the Vs line and ground the Vd line, where the selected one or more programmable resistive elements change their resistive state from a low resistive state to a high resistive state. If more than one programmable resistive element is selected (e.g., a row or a column of elements, or more), the number of elements that change their state increases over the time during which the program signal is applied. If applied for a long enough period, all selected programmable resistive elements will be programmed to the high resistive state. To lower the overall resistive value of array 500, programming circuit 112 is configured to apply a program signal to the Vd line and ground the Vs line, where the selected one or more programmable resistive elements change from a high resistive state to a low resistive state. If more than one programmable resistive element is selected (e.g., a row or a column of elements, or more), the number of elements that change their state increases over the time during which the program signal is applied. If applied for a long enough period, all selected programmable resistive elements will be programmed to the low resistive state.

During operation, programming circuit 112 is configured to apply all control signals S(1)-(N) and D(1)-(M) to respectively close all switches 502(1)-(N) and 508(1)-(M). The Vs and Vd lines serve as electrodes of the variable tunable element.

Figure 2:
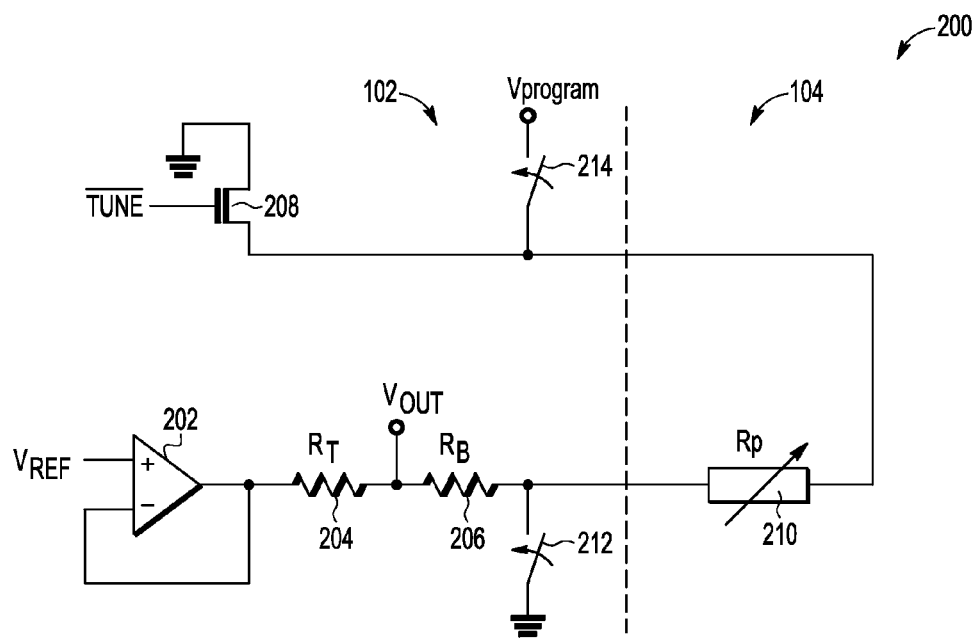
FIG. 2 illustrates a block diagram depicting an example reference signal generation circuit in which the disclosure is implemented, according to some embodiments.

FIG. 2 illustrates a block diagram depicting an example reference signal generation circuit 200 that utilizes a programmable resistive element Rp 210 as a variable tunable element. Reference signal generation circuit 200 includes components formed during FEOL processing, which are illustrated as components within device levels 102, and components formed during BEOL processing, which are illustrated as components within wiring levels 104. FEOL components 102 include operational amplifier (op-amp) 202, resistor 204, resistor 206, grounding switch 208, and tuning switches 212 and 214, which is one embodiment of front-end circuitry 106. BEOL components 104 include programmable resistive element Rp 210.

In some embodiments, Rp 210 represents one or more programmable resistive elements utilized as a variable tuning element, such as a single element (as similarly illustrated in FIGS. 1 and 6), or an array of elements (as similarly illustrated in FIG. 5). In some embodiments, Rp 210 is coupled to a front-end element 108 in a manner like that shown in FIG. 1 (e.g., coupled in series, where Ef 108 would be located between resistor 206 and Rp 210, or resistor 206 serves as Ef 108). In some embodiments, Rp 210 is coupled to a front-end element 108 in a manner like that shown in FIG. 6 (e.g., coupled in parallel, where Ef 108 would be located in parallel with Rp 210). In some embodiments, switches 208, 212, and 214 are implemented using a type of transistor suitable for implementing the control signal scheme discussed herein, including an n-channel transistor, a p-channel transistor, or other suitable switching device.

Op-amp 202 includes a non-inverting input (illustrated with a plus (+) sign), an inverting input (illustrated with a minus (−) sign), and an output. The non-inverting input receives a reference voltage (Vref) signal and the output of op-amp 202 is coupled to the inverting input to provide negative feedback. The output of op-amp 202 is also coupled to resistor 204 that in turn is coupled to resistor 206 in series. An output node of reference signal generation circuit 200 is located between resistors 204 and 206, which provides a desired output signal. In some embodiments, the output node provides a voltage output (Vout) signal, such as when op-amp 202 is configured as a voltage follower. In other embodiments, the output node provides a current output signal, such as when op-amp 202 is configured as a current source or as a transconductance amplifier.

Resistor 206 is coupled to programmable resistive element Rp 210 in series, which in turn is coupled to ground via grounding switch 208 (which may be a transistor or other suitable switching element). Grounding switch 208 has a control electrode coupled to receive an inverted tune signal from programming circuit 112. During operating mode, programming circuit 112 is configured to output an inactive tune signal. Grounding switch 208 receives the inverted inactive tune signal and is closed during operating mode, completing the connection from Rp 210 to ground. The tune signal is also utilized as a control signal for tuning switches 212 and 214. During operating mode, switches 212 and 214 receive the inactive tune signal and remain open. Also during operating mode (e.g., at least once or periodically), programming circuit 112 is configured to measure a signal at the output node and determine whether tuning is required. If so, programming circuit 112 enters program mode.

During program mode, programming circuit 112 is configured to output an active tune signal. Grounding switch 208 receives the inverted active tune signal and is open during program mode, breaking the connection from Rp 210 to ground. Also during program mode, switches 212 and 214 receive the active tune signal. In response, switch 212 closes the connection between one electrode of Rp 210 and ground, and switch 214 closes the connection between another electrode of Rp 210 and a programming node that provides a program signal output by programming circuit 112. In some embodiments, the programming signal is a program voltage (Vprogram) signal. In other embodiments, the program signal is a program current (Iprogram) signal.

Figure 3:
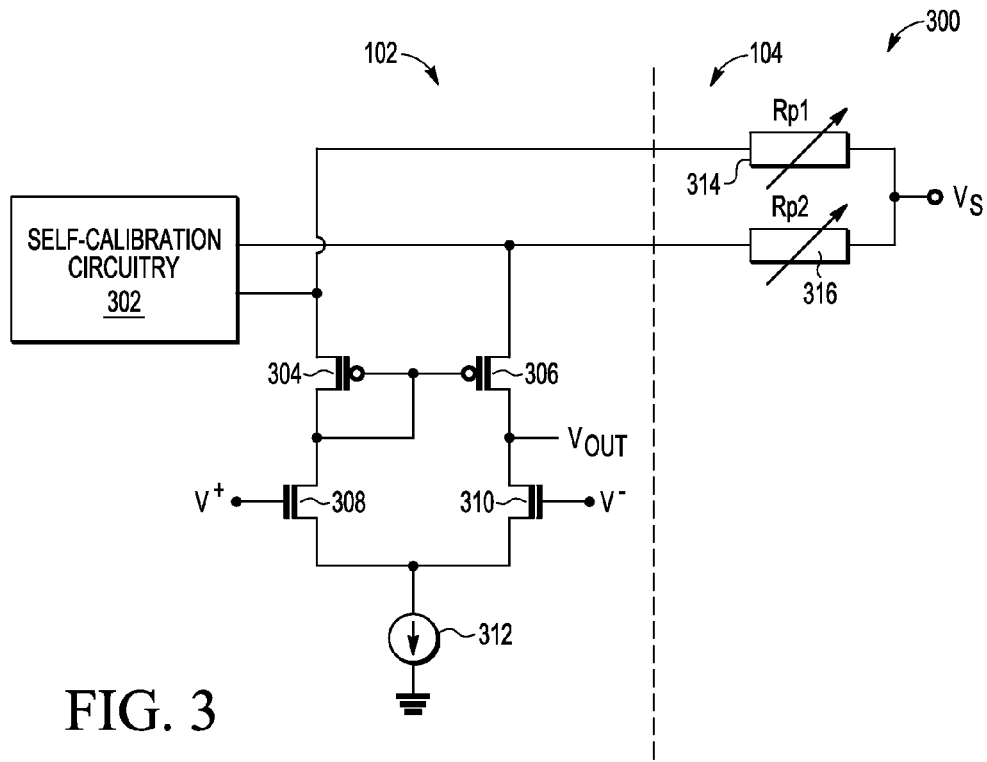
FIGS. 3 and 4 illustrate block diagrams depicting example differential circuits in which the disclosure is implemented, according to some embodiments.

FIG. 3 illustrates a block diagram depicting an example differential circuit 300 that utilizes programmable resistive elements Rp 314 and 316 as variable tunable elements. Differential circuit 300 includes components formed during FEOL processing, which are illustrated as components within device levels 102, and components formed during BEOL processing, which are illustrated as components within wiring levels 104. FEOL components 102 include self-calibration circuitry 302, transistors 304, 306, 308, and 310, and current sink 312, which is one embodiment of front-end circuitry 106. Current sink 312 is configured to provide a constant current. BEOL components 104 include programmable resistive elements Rp1 314 and Rp2 316.

In some embodiments, Rp1 and Rp2 each represent one or more programmable resistive elements utilized as variable tuning elements, such as a single element (as similarly illustrated in FIGS. 1 and 6), or an array of elements (as similarly illustrated in FIG. 5). In some embodiments, Rp1 and Rp2 are each coupled to a respective front-end element 108 in a manner like that shown in FIG. 1 (e.g., coupled in series, where one Ef 108 would be located between Rp1 and transistor 304 and another Ef 108 would be located between Rp2 and transistor 306). In some embodiments, Rp1 and Rp2 are each coupled to a respective front-end element 108 in a manner like that shown in FIG. 6 (e.g., coupled in parallel, where on Ef 108 would be located in parallel with Rp1 and another Ef 108 would be located in parallel with Rp2). In some embodiments, transistors 308 and 310 include a suitable type of transistor, such as n-channel transistors. In some embodiments, transistors 304 and 306 include a type of transistor that is complementary to transistors 308 and 310, such as p-channel transistors.

Self-calibration circuitry 302 is one embodiment of programming circuit 112 and includes similar functionality as described above. Self-calibration circuitry 302 is coupled to Rp1 314 and Rp2 316 in a manner similar to that described above in connection with FIG. 2, where FEOL components 102 include one pair of tuning switches (like switches 212 and 214 shown in FIG. 2) that couple Rp1 between a program signal node and ground during program mode, and another pair of tuning switches (like switches 212 and 214 shown in FIG. 2) that couple Rp2 between another program signal node and ground during program mode. Self-calibration circuitry 302 is also coupled to the control electrodes of the tuning switches. Self-calibration circuitry 302 is configured to tune electrical characteristics of differential circuit 300 by utilizing Rp1 and Rp2 as variable tuning elements. Self-calibration circuitry 302 is configured to program Rp1 by applying an appropriate program signal to Rp1, and to program Rp2 by applying an appropriate program signal to Rp2, in a manner similar as that described above.

In the embodiment shown in FIG. 3, Rp1 314 and Rp2 316 each have an electrode coupled to a source voltage (Vs) node. Rp1 has another electrode coupled to a source electrode of transistor 304. Rp2 has another electrode coupled to a source electrode of transistor 306. A control electrode of transistor 304 is coupled to a control electrode of transistor

306. A drain electrode of transistor 304 is coupled or tied to the control electrode of transistor 304. A drain electrode of transistor 306 is coupled to an output node. A drain electrode of transistor 308 is coupled to the drain electrode of transistor 304, and a source electrode of transistor 308 is coupled to an input of current sink 312. A control electrode of transistor 308 is coupled to a non-inverting (V+) input node. A control electrode of transistor 310 is coupled to an inverting (V−) input node. A drain electrode of transistor 310 is coupled to the drain electrode of transistor 306, and a source electrode of transistor 310 is also coupled to the input of current sink 312. Current sink 312 has an output coupled to ground.

Transistors 304 and 306 form a current mirror circuit having parallel circuit branches, where an amount of current that passes through the current electrodes of transistor 304 (e.g., one branch of the current mirror circuit) ideally matches the amount of current that passes through the current electrodes of transistor 306 (e.g., another branch of the current mirror circuit). However, if transistor 304 and 306 are mismatched, one branch of the current mirror circuit would pass a greater amount of current than the other branch. Similarly, if transistors 308 and 310 are mismatched, one branch of differential circuit 300 (e.g., transistors 304 and 308 coupled in series) would pass a different amount of current than the other branch (e.g., transistors 306 and 310 coupled in series).

In one embodiment of program mode, self-calibration circuitry 302 is configured to connect the output node to the inverting V− input node (e.g., close a switch between the output node and V− node to provide negative feedback) in order to tune current mirror and compensate for any mismatch of the transistors used in differential circuit 300, including transistors 308 and 310. Such a configuration is a voltage follower, where the output voltage (Vout) is expected to equal the input voltage (Vin) at the non-inverting (V+) input node. If Vout does not match Vin, self-calibration circuitry 302 is configured to adjust the resistive state of Rp1, or Rp2, or both, until Vout matches Vin or at least comes within some acceptable tolerance of Vin. For example, a difference can be measured between Vout and Vin, where the difference indicates whether Vout is greater than Vin, or Vin is greater than Vout. A program signal is selected based on the difference, which is used to adjust the resistive state of at least one of Rp1 and Rp2 accordingly. The resistive state is repeatedly adjusted until the difference between Vout and Vin is less than a tolerance threshold value, or until Vout falls within a target signal range around Vin as the target signal. Self-calibration circuitry 302 is also coupled to the output node and to the non-inverting (V+) input node and is configured to take measurements of Vout and Vin.

If Vout is less than Vin, a program signal is applied to Rp2 to lower the resistive state of Rp2. As the resistive state of Rp2 lowers, a smaller voltage drop occurs over Rp2 and raises the voltage provided to the source electrode of transistor 306, which in turn raises the voltage at the output node. If Vout is greater than Vin, a program signal is applied to Rp2 to raise the resistive state of Rp2, which increases the voltage drop over Rp2 and reduces the voltage provided to the source electrode of transistor 306, which in turn reduces the voltage at the output node. In another embodiment (such as when Rp1 and Rp2 are initialized to a high resistive state), if Vout is greater than Vin, a program signal is applied to Rp1 to lower the resistive state of Rp1 and reduces the voltage drop over Rp1. This raises the voltage at the source electrode of transistor 304, which in turn raises the voltage at the drain electrode of transistor 308 to match Vout (e.g., effectively raising Vin). In another embodiment (such as when Rp1 and Rp2 have reached a low resistive state), if Vout is less than Vin, a program signal is applied to Rp1 to raise the resistive value of Rp1, which increases the voltage drop over Rp1. This lowers the voltage at the source electrode of transistor 304, which in turn lowers the voltage at the drain electrode of transistor 308 to match Vout (e.g., effectively lowering Vin). The program signal applied to a given programmable resistive element (like Rp1 and Rp2) may also be selected based on the magnitude of the difference between Vout and Vin. For example, a small difference may correspond to a program signal that implements a stepwise increase or decrease in the resistive state, while a large difference may correspond to a program signal that implements a cumulative increase or decrease in the resistive state, as discussed above.

In another embodiment of program mode, self-calibration circuitry 302 is configured to take measurements of the current passed by the branches of current mirror circuit (e.g., transistors 304 and 306), where self-calibration circuitry 302 is also coupled to the source electrodes of transistors 304 and 306. Since the branches of current mirror circuit are also coupled to transistors 308 and 310 in series, the current measurements at source electrodes of transistors 304 and 306 would also reflect any mismatch of the transistors 308 and 310 of differential circuit 300. If the current measurements of the branches do not match, self-calibration circuitry 302 is configured to adjust the resistive state of Rp1, of Rp2, or both, until the current measurements match or at least comes within some acceptable tolerance. For example, a difference can be measured between the current measurements, where the difference indicates which of the current measurements is greater. A program signal is selected based on the difference, which is used to adjust the resistive state of at least one of Rp1 and Rp2 accordingly. The resistive state is repeatedly adjusted until the difference between the current measurements is less than a tolerance threshold value, or until the current measurement of one branch falls within a target signal range around the current measurement of the other branch as the target signal. This compensates for any mismatch of transistors 304, 306, 308, and 310 included in the branches of differential circuit 300.

For example, the resistive state of Rp1 or Rp2 can be lowered to increase current or raised to decrease current. The resistive state of Rp1 can be lowered or raised until the current at the source electrode of transistor 304 matches the current at the source electrode of transistor 306. Similarly, the resistive state of Rp2 can be lowered or raised until the current at the source electrode of transistor 304 matches the current at the source electrode of transistor 306. The program signal applied to a given programmable resistive element (like Rp1 and Rp2) may be selected based on the magnitude of the difference between the current measurements. For example, a small difference may correspond to a program signal that implements a stepwise increase or decrease in the resistive state, while a large difference may correspond to a program signal that implements a cumulative increase or decrease in the resistive state, as discussed above.

Figure 4:
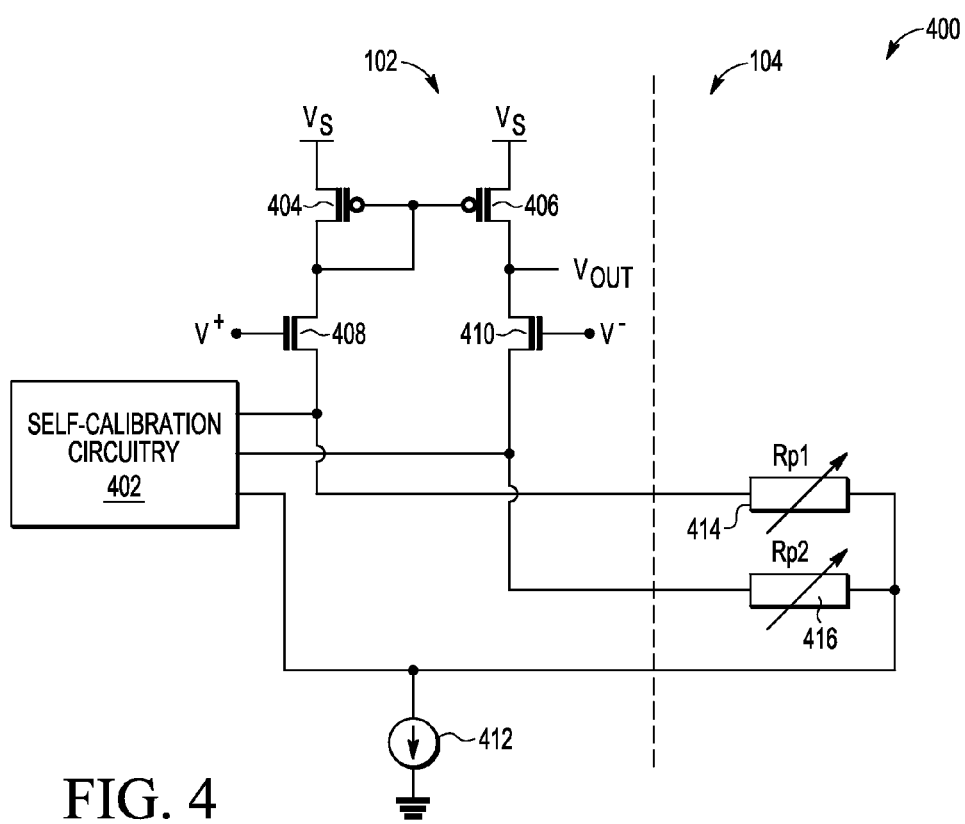

FIG. 4 illustrates a block diagram depicting another example differential circuit 400 including components similar to those illustrated in FIG. 3. In the embodiment illustrated, FEOL components 102 include self-calibration circuitry 402, transistors 404, 406, 408, and 410, and current sink 412, which is one embodiment of front-end circuitry 106. BEOL components 104 include programmable resistive elements Rp1 414 and Rp2 416.

Self-calibration circuitry 402 is coupled to Rp1 and Rp2 in a manner similar to that described above in connection with FIG. 3, including tuning switches. Self-calibration circuitry 402 is configured to tune electrical characteristics of differential circuit 400 by utilizing Rp1 and Rp2 as variable tuning elements. In some embodiments, transistors 408 and 410 include a suitable type of transistor, such as n-channel transistors. In some embodiments, transistors 404 and 406 include a type of transistor that is complementary to transistors 408 and 410, such as p-channel transistors.

In the embodiment shown in FIG. 4, transistors 404 and 406 each have a source electrode coupled to a source voltage (Vs) node. A control electrode of transistor 404 is coupled to a control electrode of transistor 406. A drain electrode of transistor 404 is tied to the control electrode of transistor 404. A drain electrode of transistor 408 is coupled to the drain electrode of transistor 404. A drain electrode of transistor 410 is coupled to the drain electrode of transistor 406. A control electrode of transistor 408 is coupled to a non-inverting (V+) input node. A control electrode of transistor 410 is coupled to an inverting (V−) input node. A source electrode of transistor 408 is coupled to an electrode of Rp1 and a source electrode of transistor 410 is coupled to an electrode of Rp2. Rp1 and Rp2 each have an electrode coupled to an input of current sink 412. Self-calibration circuitry 402 is also coupled to the input of current sink 412, to the source electrode of transistor 408, and to the source electrode of transistor 410.

Like transistors 304 and 306 of FIG. 3, transistors 404 and 406 form a current mirror circuit. Self-calibration circuitry 402 is configured to connect the output node to the inverting V− input node (e.g., close a switch between the output node and V− node to provide negative feedback) during program mode in order to tune the current mirror and compensate for any mismatch of the transistors used in differential circuit 400. If Vout does not match Vin at V+ node, self-calibration circuitry 402 is configured to adjust the resistive state of Rp1, or Rp2, or both, until Vout matches Vin or at least comes within some acceptable tolerance of Vin. Self-calibration circuitry 402 is also coupled to the output node and to the non-inverting (V+) input node and is configured to take measurements of Vout and Vin.

If Vout is less than Vin, a program signal is applied to Rp2 to raise the resistive state of Rp2, which increases the voltage drop over Rp2, which in turn raises the voltage at the output node. If Vout is greater than Vin, a program signal is applied to Rp2 to reduce the resistive state of Rp2, which decreases the voltage drop over Rp2, which in turn lowers the voltage at the output node. In another embodiment (such as when Rp1 and Rp2 reach a low resistive state), if Vout is greater than Vin, a program signal is applied to Rp1 to increase the resistive state of Rp1 and increase the voltage drop over Rp1, which in turn raises the voltage at the drain electrode of transistor 408 to match Vout (e.g., effectively raising Vin). Also in another embodiment (such as when Rp1 and Rp2 are initialized at a high resistive state), if Vout is less than Vin, a program signal is applied to Rp1 to lower the resistive state of Rp1 and reduce the voltage drop over Rp1, which in turn lowers the voltage at the drain electrode of transistor 408 to match Vout (e.g., effectively lowering Vin). The program signal applied may also be selected based on the magnitude of the difference between Vout and Vin, as discussed above.

In another embodiment of program mode, self-calibration circuitry 402 is configured to take measurements of the current passed by the branches of differential circuit 400. Since the branches of current mirror circuit (e.g., transistors 404 and 406) are also coupled to transistors 408 and 410 in series, the current measurements at the source electrodes of transistors 408 and 410 reflect any mismatch of transistors 404, 406, 408, and 410 of differential circuit 400. If the current measurements of the branches do not match, self-calibration circuitry 402 is configured to adjust the resistive state of Rp1, of Rp2, or both, until the current measurements match or at least come within some acceptable tolerance, which compensates for any mismatch of the resistors in differential circuit 300.

As noted above, the resistive state of Rp1 or Rp2 can be lowered to increase current or raised to decrease current. The resistive state of Rp1 can be lowered or raised until the current at the source electrode of transistor 408 matches the current at the source electrode of transistor 410. Similarly, the resistive state of Rp2 can be lowered or raised until the current at the source electrode of transistor 410 matches the current at the source electrode of transistor 408. The program signal applied may also be selected based on the magnitude of the difference between the current measurements, as discussed above.

By now it should be appreciated that there has been provided disclosure for utilizing programmable resistive elements as variable tuning elements, which are configured to trim or tune electrical characteristics of circuitry. In one embodiment of the present disclosure, an integrated circuit is provided, which includes a reference signal generation circuit that in turn includes a first resistor and a second resistor formed in at least one front end of line (FEOL) device level of the integrated circuit, where the first resistor and the second resistor are coupled in series. The reference signal generation circuit also includes an output node between the first resistor and the second resistor, where a reference signal is generated at the output node, and a programmable resistive element formed in at least one back end of line (BEOL) wiring level of the integrated circuit, where the programmable resistive element is coupled in series with the second resistor, and a non-volatile resistive state of the programmable resistive element is variable across a plurality of non-volatile resistive states in response to a program signal applied to the programmable resistive element.

One aspect of the above embodiment provides that the integrated circuit further includes a program circuit coupled to the programmable resistive element, wherein the program circuit is configured to adjust the non-volatile resistive state of the programmable resistive element to trim the reference signal.

A further aspect of the above embodiment provides that the program circuit is further coupled to the output node and is further configured to measure a first reference signal at the output node, in response to a selection of a program mode, and apply a selected program signal to the programmable resistive element to adjust the non-volatile resistive state to another one of the plurality of non-volatile resistive states, in response to a determination that the first reference signal is not within a target signal range.

A still further aspect of the above embodiment provides that the selected program signal is selected from a plurality of program signals that each have an associated magnitude, polarity, and duration, each of the plurality of program signals corresponds to an adjustment from the non-volatile resistive state to another one of the plurality of non-volatile resistive states, each of the plurality of program signals is associated with one of a plurality of signal ranges outside of the target signal range, and the selected program signal is associated with one of the plurality of signal ranges within which the first reference signal falls.

Another further aspect of the above embodiment provides that the reference signal includes a reference voltage, a first program signal is configured to adjust the programmable resistive element to a higher non-volatile resistive state, in response to the first reference signal having a value that is less than the target signal range, and a second program signal is configured to adjust the programmable resistive element to a lower non-volatile resistive state, in response to the first reference signal having a value that is greater than the target signal range.

Another further aspect of the above embodiment provides that the reference signal includes a reference current, a first program signal is configured to adjust the programmable resistive element to a lower non-volatile resistive state, in response to the first reference signal having a value that is less than the target signal range, and a second program signal is configured to adjust the programmable resistive element to a higher non-volatile resistive state, in response to the first reference signal having a value that is greater than the target signal range.

Another aspect of the above embodiment provides that the plurality of non-volatile resistive states includes a logic high non-volatile resistive state and a logic low non-volatile resistive state.

Another aspect of the above embodiment provides that the integrated circuit further includes a third resistor formed in at least one FEOL device level, where the third resistor is coupled in parallel with the programmable resistive element, and the third resistor includes polysilicon.

Another aspect of the above embodiment provides that the programmable resistive element includes an array of programmable resistive sub-elements, the array includes a first dimension of M and a second dimension of N, M and N each being integers of 1 or greater, and one or more non-volatile resistive states of the programmable resistive sub-elements vary in response to the program signal applied to the programmable resistive element.

In another embodiment of the present disclosure, an integrated circuit is provided that includes a differential circuit, which in turn includes a current mirror circuit formed in at least one front end of line (FEOL) device level of the integrated circuit, where the current mirror circuit includes a first circuit branch and a second circuit branch that are coupled in parallel with one another, and a first transistor and a second transistor formed in at least one FEOL device level of the integrated circuit, where the first and second transistors are respectively coupled in series with the first and second circuit branches of the current mirror circuit, the first transistor has a control gate electrode coupled to a noninverting input node, and the second transistor has a control gate electrode coupled to an inverting input node. The differential circuit also includes an output node between the second circuit branch of the current mirror circuit and the second transistor, a first programmable resistive element formed in at least one back end of line (BEOL) wiring level of the integrated circuit, where the first programmable resistive element is coupled in series with the first transistor and the first circuit branch, and a second programmable resistive element formed in at least one BEOL wiring level of the integrated circuit, where the second programmable resistive element is coupled in series with the second transistor and the second circuit branch.

One aspect of the above embodiment provides that the integrated circuit further includes a calibration circuit coupled to the first and second programmable resistive elements, where the calibration circuit is configured to close a connection between the output node and the inverting input node, in response to a selection of a program mode, and apply a selected program signal to adjust a non-volatile resistive state of one or more of the first and second programmable resistive elements to trim the differential circuit, where the selected program signal is selected from a plurality of program signals that each have an associated magnitude, polarity, and duration, and each of the plurality of program signals corresponds to an adjustment from the non-volatile resistive state to another one of the plurality of non-volatile resistive states.

A further aspect of the above embodiment provides that the calibration circuit is further configured to measure a first signal of the differential circuit, and apply the selected program signal in response to a determination that the first signal does not match a target signal, where the selected program signal is selected based on a difference between the first signal and the target signal, and the difference indicates which of the first signal and the target signal is larger.

A still further aspect of the above embodiment provides that the selected program signal corresponds to a small change in the non-volatile resistive state, in response to a magnitude of the difference failing to exceed a difference threshold; and the selected program signal corresponds to a large change in the non-volatile resistive state, in response to the magnitude exceeding the difference threshold.

Another further aspect of the above embodiment provides that the first signal includes a first voltage signal measured at the output node, and the target signal includes a target voltage signal applied at the noninverting node.

Another further aspect of the above embodiment provides that the first signal includes a first current signal measured at the first circuit branch, and the target signal includes a target current signal measured at the second circuit branch.

Another aspect of the above embodiment provides that the first programmable resistive element is further coupled to a first resistor formed in at least one FEOL device level of the integrated circuit, the first resistor includes polysilicon, and the first resistor is coupled to the first programmable resistive element via a connection that includes one of a series connection and a parallel connection.

Another aspect of the above embodiment provides that the first programmable resistive element includes an array of programmable resistive sub-elements, the array includes a first dimension of M and a second dimension of N, M and N each being integers of 1 or greater, and one or more non-volatile resistive states of the first programmable resistive sub-elements vary in response to a program signal applied to the first programmable resistive element.

In another embodiment of the present disclosure, a method for calibrating a signal of an integrated circuit is provided, where the method includes measuring a first signal at a node of the integrated circuit, where at least part of the integrated circuit is formed in at least one front end of line (FEOL) device level, a programmable resistive element is coupled in series with the node, the programmable resistive element is formed in at least one back end of line (BEOL) wiring level, and the programmable resistive element is in a non-volatile resistive state that is variable across a plurality of non-volatile resistive states in response to a program signal applied to the programmable resistive element; and applying a selected program signal to the programmable resistive element to adjust the non-volatile resistive state to another one of the plurality of non-volatile resistive states, in response to a determination that the first signal is not within a target signal range.

One aspect of the above embodiment provides that the method further includes selecting the selected program signal from a plurality of program signals, where each of the plurality of program signals has an associated magnitude, polarity, and duration, each of the plurality of program signals corresponds to an adjustment from the non-volatile resistive state to another one of the plurality of non-volatile resistive states, each of the plurality of program signals is associated with one of a plurality of signal ranges outside of the target signal range, and the selected program signal is associated with one of the plurality of signal ranges within which the first signal falls.

Another aspect of the above embodiment provides that the target signal range includes one of: a target voltage range, wherein the first signal includes a voltage signal measured at an output node of the integrated circuit, and wherein a target voltage signal is applied at an input node of the integrated circuit; and a target current range, wherein the first signal includes a current signal measured at a first circuit branch of a pair of circuit branches coupled in parallel of the integrated circuit, and wherein a target current signal is measured at a second circuit branch of the pair of circuit branches.

The circuitry described herein may be implemented on a semiconductor substrate, which can be any semiconductor material or combinations of materials, such as gallium arsenide, silicon germanium, silicon-on-insulator (SOI), silicon, monocrystalline silicon, the like, and combinations of the above.

The terms "assert" or "set" and "negate" (or "deassert" or "clear") are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Each signal described herein may be designed as positive or negative logic, where negative logic can be indicated by a bar over the signal name or an asterix (*) following the name. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the invention has been described with respect to specific conductivity types or polarity of potentials, skilled artisans appreciated that conductivity types and polarities of potentials may be reversed.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. An integrated circuit comprising:
 a reference signal generation circuit comprising:
  a first resistor and a second resistor formed in at least one front end of line (FEOL) device level of the integrated circuit, wherein
   the first resistor and the second resistor are coupled in series,
  an output node between the first resistor and the second resistor, wherein a reference signal is generated at the output node, and
  a programmable resistive element formed in at least one back end of line (BEOL) wiring level of the integrated circuit, wherein
   the programmable resistive element is coupled in series with the second resistor, and
   a non-volatile resistive state of the programmable resistive element is variable across a plurality of non-volatile resistive states in response to a program signal applied to the programmable resistive element.

2. The integrated circuit of claim 1, further comprising:
 a program circuit coupled to the programmable resistive element, wherein the program circuit is configured to adjust the non-volatile resistive state of the programmable resistive element to trim the reference signal.

3. The integrated circuit of claim 2, wherein
 the program circuit is further coupled to the output node and is further configured to measure a first reference signal at the output node, in response to a selection of a program mode, and apply a selected program signal to the programmable resistive element to adjust the non-volatile resistive state to another one of the plurality of non-volatile resistive states, in response to a determination that the first reference signal is not within a target signal range.

4. The integrated circuit of claim 3, wherein
the selected program signal is selected from a plurality of program signals that each have an associated magnitude, polarity, and duration,
each of the plurality of program signals corresponds to an adjustment from the non-volatile resistive state to another one of the plurality of non-volatile resistive states,
each of the plurality of program signals is associated with one of a plurality of signal ranges outside of the target signal range, and
the selected program signal is associated with one of the plurality of signal ranges within which the first reference signal falls.

5. The integrated circuit of claim 3, wherein
the reference signal comprises a reference voltage,
a first program signal is configured to adjust the programmable resistive element to a higher non-volatile resistive state, in response to the first reference signal having a value that is less than the target signal range, and
a second program signal is configured to adjust the programmable resistive element to a lower non-volatile resistive state, in response to the first reference signal having a value that is greater than the target signal range.

6. The integrated circuit of claim 3, wherein
the reference signal comprises a reference current,
a first program signal is configured to adjust the programmable resistive element to a lower non-volatile resistive state, in response to the first reference signal having a value that is less than the target signal range, and
a second program signal is configured to adjust the programmable resistive element to a higher non-volatile resistive state, in response to the first reference signal having a value that is greater than the target signal range.

7. The integrated circuit of claim 1, wherein
the plurality of non-volatile resistive states comprises a logic high non-volatile resistive state and a logic low non-volatile resistive state.

8. The integrated circuit of claim 1, further comprising:
a third resistor formed in at least one FEOL device level, wherein
the third resistor is coupled in parallel with the programmable resistive element, and
the third resistor comprises polysilicon.

9. The integrated circuit of claim 1, wherein
the programmable resistive element comprises an array of programmable resistive sub-elements,
the array comprises a first dimension of M and a second dimension of N,
M and N each being integers of 1 or greater, and
one or more non-volatile resistive states of the programmable resistive sub-elements vary in response to the program signal applied to the programmable resistive element.

* * * * *